(12) United States Patent
Kao

(10) Patent No.: US 9,666,473 B2
(45) Date of Patent: May 30, 2017

(54) MANUFACTURING METHOD OF SEMICONDUCTOR DEVICE

(71) Applicant: UNITED MICROELECTRONICS CORP., Hsinchu (TW)

(72) Inventor: Ching-Hung Kao, Hsinchu County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/160,278

(22) Filed: May 20, 2016

(65) Prior Publication Data

US 2016/0268159 A1 Sep. 15, 2016

Related U.S. Application Data

(62) Division of application No. 14/076,358, filed on Nov. 11, 2013, now Pat. No. 9,406,710.

(51) Int. Cl.
| | |
|---|---|
| *H01L 21/761* | (2006.01) |
| *H01L 21/762* | (2006.01) |
| *H01L 27/146* | (2006.01) |
| *H01L 21/306* | (2006.01) |
| *H01L 21/308* | (2006.01) |
| *H01L 29/06* | (2006.01) |
| *H01L 29/66* | (2006.01) |

(52) U.S. Cl.
CPC .... *H01L 21/76224* (2013.01); *H01L 21/3083* (2013.01); *H01L 21/3085* (2013.01); *H01L 21/30604* (2013.01); *H01L 21/76237* (2013.01); *H01L 27/1463* (2013.01); *H01L 27/14689* (2013.01); *H01L 29/0649* (2013.01); *H01L 29/66553* (2013.01)

(58) Field of Classification Search
None
See application file for complete search history.

(56) References Cited

U.S. PATENT DOCUMENTS

| | | | |
|---|---|---|---|
| 2002/0115270 A1 | 8/2002 | Wu | |
| 2004/0021194 A1* | 2/2004 | Mann | H01L 27/14683 257/506 |
| 2006/0267134 A1 | 11/2006 | Tilke et al. | |
| 2007/0212848 A1* | 9/2007 | Sandhu | H01L 21/76232 438/424 |
| 2008/0213972 A1 | 9/2008 | Disney et al. | |
| 2008/0290461 A1 | 11/2008 | Moens et al. | |
| 2010/0032728 A1* | 2/2010 | Hao | H01L 21/76264 257/262 |
| 2010/0323470 A1 | 12/2010 | Venezia et al. | |
| 2011/0115047 A1* | 5/2011 | Hebert | H01L 21/743 257/508 |
| 2012/0025199 A1 | 2/2012 | Chen et al. | |
| 2012/0104539 A1 | 5/2012 | Mehrotra | |

(Continued)

*Primary Examiner* — Charles Garber
*Assistant Examiner* — Alia Sabur
(74) *Attorney, Agent, or Firm* — WPAT, PC; Justin King

(57) ABSTRACT

A semiconductor device and a manufacturing method thereof are disclosed. The semiconductor device includes a silicon substrate, a spacer, a doped region, and a deep trench isolation (DTI). The silicon substrate has a deep trench. The spacer is formed on an upper portion of the sidewall of the deep trench. The doped region is formed on a lower portion of the sidewall of the deep trench. The deep trench isolation is formed in the deep trench.

9 Claims, 6 Drawing Sheets

(56) References Cited

U.S. PATENT DOCUMENTS

| | | |
|---|---|---|
| 2013/0009277 A1 | 1/2013 | Dube et al. |
| 2013/0113061 A1 | 5/2013 | Lai et al. |
| 2013/0134550 A1 | 5/2013 | Tanaka et al. |
| 2013/0140667 A1 | 6/2013 | Kalnitsky et al. |
| 2013/0328161 A1 | 12/2013 | Cheng et al. |
| 2015/0048427 A1* | 2/2015 | Hu .................... H01L 27/14643 257/239 |

* cited by examiner

//MANUFACTURING METHOD OF SEMICONDUCTOR DEVICE

This is a divisional application of co-pending application Ser. No. 14/076,358, filed Nov. 11, 2013, the subject matter of which is incorporated herein by reference.

TECHNICAL FIELD

The disclosure relates in general to a semiconductor device and a manufacturing method thereof, and more particularly to a semiconductor device with a deep trench isolation (DTI) and a manufacturing method thereof.

DESCRIPTION OF THE RELATED ART

Complementary metal-oxide-semiconductor (CMOS) image sensors (CIS) are widely used in a variety of applications. The devices utilizing CMOS image sensors are, for example, digital cameras, mobile phone cameras, and etc. In an image sensor device, pixels are arranged in a substrate, which may include photodiodes, and lights are absorbed and converted into electrical signals.

However, CMOS image sensors may suffer from issues of such as cross-talk when isolation between pixels is poor. Therefore, it is desired to develop improved image sensor devices with deep trench isolations (DTI) for providing good isolation between pixels.

SUMMARY OF THE INVENTION

The disclosure is directed to a semiconductor device and a manufacturing method thereof. In the embodiments, a spacer and a doped region are formed on an upper portion and a lower portion of the sidewall of a deep trench respectively, in which a deep trench isolation (DTI) is formed; hence the regions near the top surface of a silicon substrate are protected by the spacer from the implantation process for forming the doped region. Accordingly, the characteristics of the semiconductor device are not influenced by the formation of the doped region.

According to an embodiment of the present disclosure, a semiconductor device is disclosed. The semiconductor device includes a silicon substrate, a spacer, a doped region, and a deep trench isolation (DTI). The silicon substrate has a deep trench. The spacer is formed on an upper portion of the sidewall of the deep trench. The doped region is formed on a lower portion of the sidewall of the deep trench. The deep trench isolation is formed in the deep trench.

According to another embodiment of the present disclosure, a manufacturing method of a semiconductor device is disclosed. The manufacturing method includes the following steps: forming a deep trench in a silicon substrate; forming a spacer on an upper portion of the sidewall of the deep trench; forming a doped region on a lower portion of the sidewall of the deep trench; and forming a deep trench isolation in the deep trench.

The disclosure will become apparent from the following detailed description of the preferred but non-limiting embodiments. The following description is made with reference to the accompanying drawings.

DETAILED DESCRIPTION OF THE INVENTION

Figure 1A:
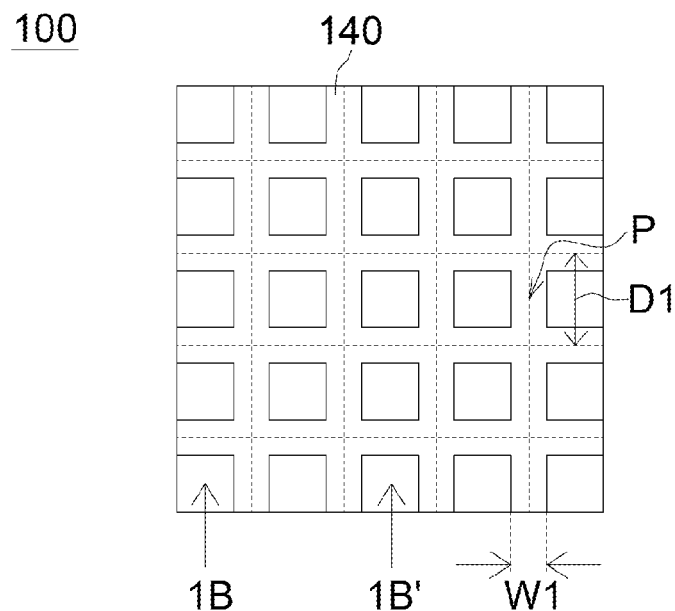
FIG. 1A shows a top view of a semiconductor device according to an embodiment of the present disclosure.

In the embodiments, a spacer and a doped region are formed on an upper portion and a lower portion of the sidewall of a deep trench respectively, in which a deep trench isolation (DTI) is formed; hence the regions near the top surface of a silicon substrate are protected by the spacer from the implantation process for forming the doped region. Accordingly, the characteristics of the semiconductor device are not influenced by the formation of the doped region. The embodiments are described in details with reference to the accompanying drawings. The procedures and details of the method of the embodiments are for exemplification only, not for limiting the scope of protection of the disclosure. Moreover, the identical elements of the embodiments are designated with the same reference numerals. Also, it is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense.

Figure 1B:
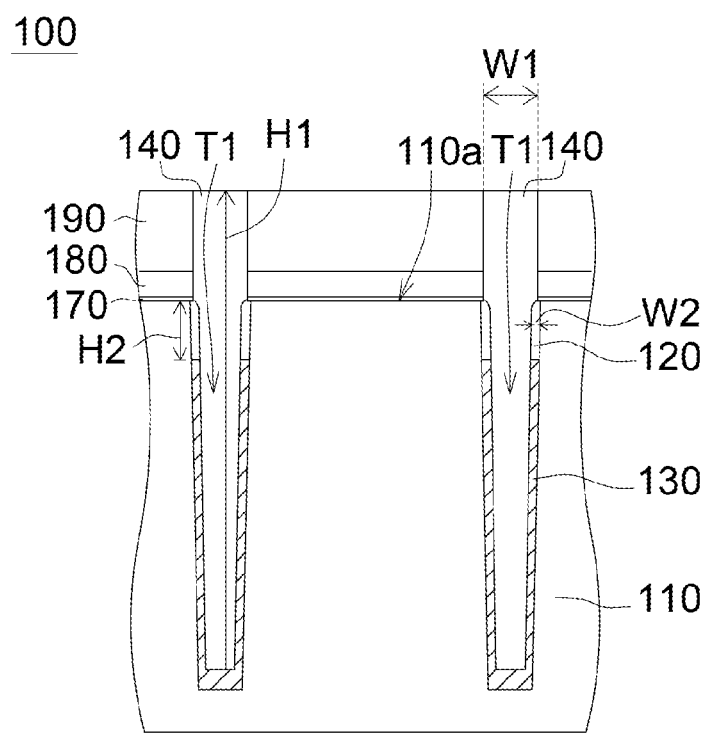
FIG. 1B shows a cross-sectional view along the section line 1B-1B' in FIG. 1A.

FIG. 1A shows a top view of a semiconductor device 100 according to an embodiment of the present disclosure, and FIG. 1B shows a cross-sectional view along the section line 1B-1B' in FIG. 1A. The semiconductor device 100 includes a silicon substrate 110, a spacer 120, a doped region 130, and a deep trench isolation (DTI) 140. The silicon substrate 110 has a deep trench T1. As shown in FIG. 1B, the spacer 120 is formed on an upper portion of the sidewall of the deep trench T1, and the doped region 130 is formed on a lower portion of the sidewall of the deep trench T1. The deep trench isolation 140 is formed in the deep trench T1.

In the embodiment, as shown in FIGS. 1A-1B, the height H1 of the deep trench isolation 140 is about 2-4 µm, and the width W1 of the deep trench isolation 140 is about 0.2 µm. As shown in FIG. 1B, the cross-section of the deep trench isolation 140 has a tapered shape.

In the embodiment, as shown in FIG. 1B, the width W2 of the spacer 120 is about 100-200 Å, and the height H2 of the spacer 120 is about 1.5-4 KÅ. The doped region 130 is adjacent to the spacer 120.

As shown in FIG. 1A, the semiconductor device 100 may further comprise a plurality of the deep trench isolations 140 and a plurality of pixels P in the silicon substrate 110. The pixels P are separated from one another by the deep trench isolations 140. In the embodiment, as shown in FIG. 1A, each of the pixels P has a dimension D1 of about 1.1-1.4 µm.

In the embodiment, as shown in FIG. 1B, the semiconductor device 100 may further comprise a pad oxide layer 170, a nitride layer 180, and a hard mask layer 190. The pad oxide layer 170 is formed on the silicon substrate 110, the nitride layer 180 is formed on the pad oxide layer 170, and the hard mask layer 190 is formed on the nitride layer 180. As shown in FIG. 1B, the deep trench T1 penetrates through the pad oxide layer 170, the nitride layer 180, and the hard mask layer 190. In the embodiment, the nitride layer 180 may be formed of silicon nitride, and the hard mask layer 190 may be formed of oxide.

Figure 2:
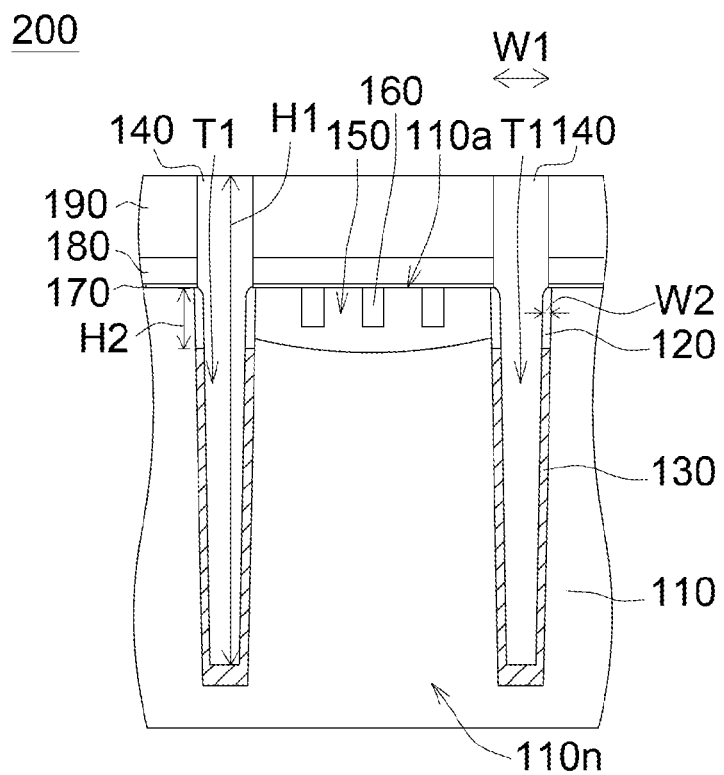
FIG. 2 shows a top view of a semiconductor device according to another embodiment of the present disclosure.

Referring to FIG. 2, a top view of a semiconductor device 200 according to another embodiment of the present disclosure is shown. The semiconductor device 200 of the present embodiment is different from the semiconductor device 100 of the previous embodiment in the details of additional components, and the similarities are not repeated here.

The semiconductor device 200 includes the silicon substrate 110, the spacer 120, the doped region 130, and the deep trench isolation 140. The silicon substrate 110 has the deep trench T1. The spacer 120 is formed on an upper portion of the sidewall of the deep trench T1. The doped region 130 is formed on a lower portion of the sidewall of the deep trench T1. The deep trench isolation 140 is formed in the deep trench T1. Likewise, referring to FIG. 1A, the semiconductor device 200 may comprise pixels P separated from one another by the deep trench isolations 140.

As shown in FIG. 2, in the embodiment, the semiconductor device 200 may further comprise a P well 150 and at least an NMOS transistor 160. The P well 150 is formed in the silicon substrate 110 and adjacent to the spacer 120. The NMOS transistor 160 is formed in the P well 150. As shown in FIG. 2, the P well 150 is separated from the doped region 130 by the spacer 120.

In the embodiment, the semiconductor device 200 may further comprise an n type-doped region 110$n$ in the silicon substrate 110 while the doped region 130 is p type. As shown in FIG. 2, the P well 150 is adjacent to the n type-doped region 110$n$, and the P well 150 and the doped region 130 are separated from each other by the n type-doped region 110$n$.

In the embodiment, the semiconductor device 200 of the present disclosure may be a CMOS image sensor device including pixels P and photodiodes, where the deep trench isolation 140 provides a good isolation between the pixels P, and the p type-doped region 130 protects the deep trench isolation 140. While the doped region 130 with heavier implantation helps to lower the dark current, the P well 150 and the NMOS transistor 160 located near the top surface 110$a$ of the silicon substrate 110 may be more easily affected by the heavier implantation process for forming the doped region 130. That is, the doping concentration of the P well 150 may increase due to the diffusion of the p type dopants from the implantation process for forming the doped region 130. In view of that, according to the embodiments of the present disclosure, the spacer 120 separating the P well 150 from the doped region 130 provides an excellent protection for the P well 150, as well as for the NMOS transistor 160, located near the top surface 110$a$ of the silicon substrate 110 from the influence by the implantation process. As such, an increase of the threshold voltage of the pixels caused by an increased doping concentration of the P well 150 can be effectively avoided. Accordingly, since the spacer 120 separates the P well 150 from the doped region 130, the doping concentration of doped region 130 may be freely adjusted without affecting the doping concentration of the P well 150. Moreover, the characteristics of the semiconductor device 200 are not influenced by the formation of the doped region 130.

The embodiments disclosed below are for elaborating a manufacturing method of the semiconductor devices of the disclosure. However, the descriptions disclosed in the embodiments of the disclosure such as detailed manufacturing procedures are for illustration only, not for limiting the scope of protection of the disclosure. Referring to FIGS. 3-10, a manufacturing method of the semiconductor device 200 according to an embodiment of the present disclosure is illustrated.

Referring to FIGS. 3-7, the deep trench T1 is formed in the silicon substrate 110, and the spacer 120 is formed on an upper portion of the sidewall of the deep trench T1. The manufacturing method of the deep trench T1 and the spacer 120 comprises, for example, the following steps as illustrated in FIGS. 3-7.

Figure 3:
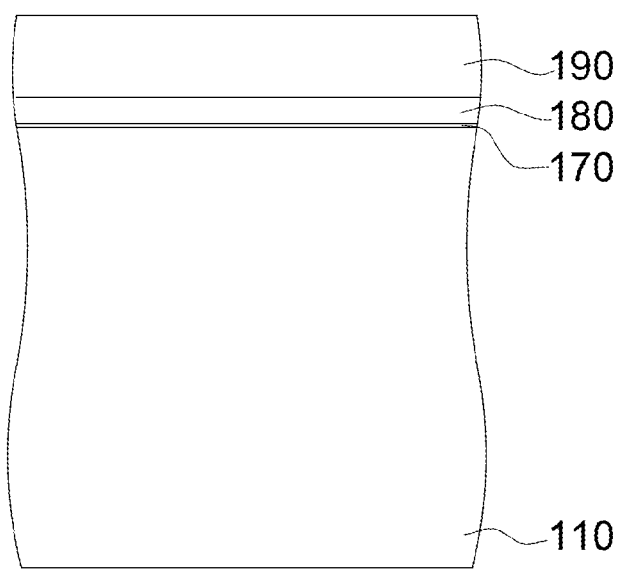
FIGS. 3-10 illustrate a manufacturing method of a semiconductor device according to an embodiment of the present disclosure.

As shown in FIG. 3, the substrate 110 is provided, the pad oxide layer 170 is formed on the silicon substrate 110, the nitride layer 180 is formed on the pad oxide layer 170, and the hard mask layer 190 is formed on the nitride layer 180.

Figure 4:
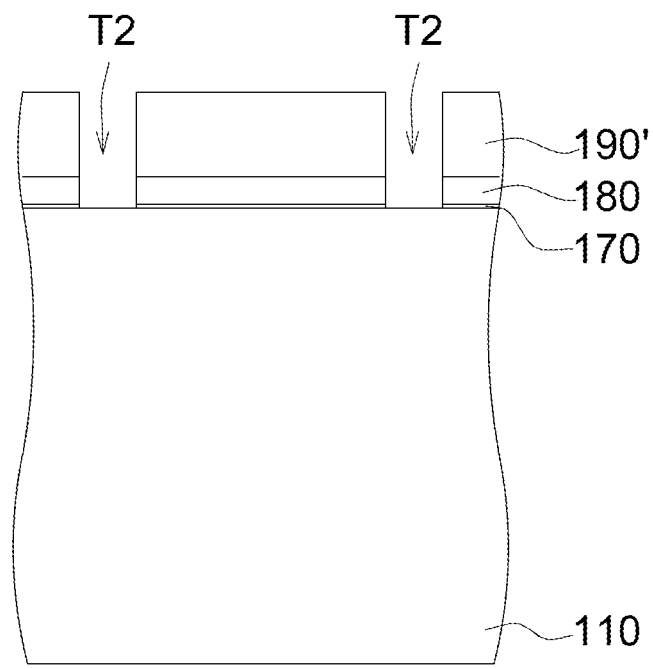

As shown in FIG. 4, a patterned hard mask 190' is provided on the silicon substrate 110. In the embodiment, the patterned hard mask 190' is formed by etching the hard mask layer 190 for forming at least a trench T2 within the patterned hard mask 190' by such as a photo/etching process. In the present embodiment, the hard mask layer 190, the nitride layer 180, and the pad oxide layer 170 may be patterned for defining the deep trench isolation(s) which will be formed in the following process. The patterning process is performed by forming the trenches T2 within the hard mask layer 190, the nitride layer 180, and the pad oxide layer 170, and the trench T2 is formed by such as a photo/etching process.

Figure 5:
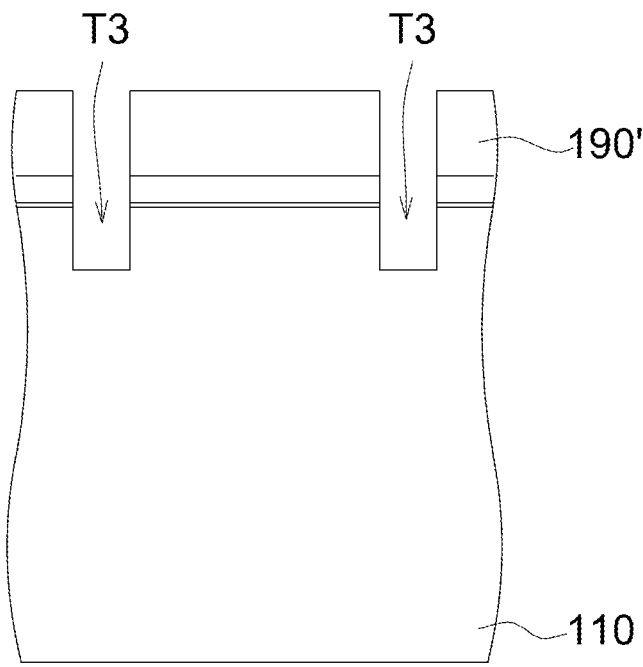

As shown in FIG. 5, the silicon substrate 100 is etched according to the patterned hard mask 190' for forming at least a shallow trench T3. The shallow trench T3 has a depth of about 1.5-4 KÅ.

Figure 6:
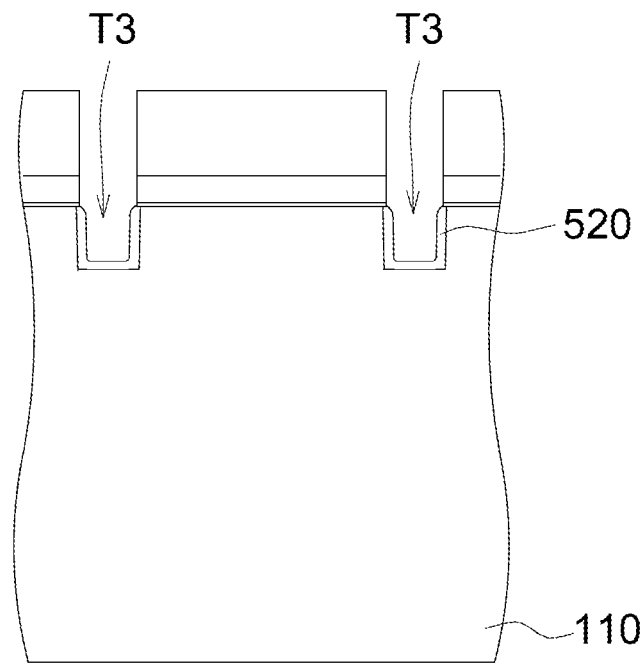

As shown in FIG. 6, an oxide layer 520 is formed in the shallow trench T3. The oxide layer 520 may be formed by a variety of processes. In an embodiment, the oxide layer 520 may be formed by depositing a layer of oxide on the bottom and sidewalls of the shallow trench T3.

In another embodiment, the oxide layer 520 may be formed by oxidizing the sidewalls of the shallow trench T2; that is, the silicon substrate 110 within the shallow trench T3. Due to the etching process performed previously for forming the shallow trench T3, the structure of the sidewalls of the shallow trench T3 is damaged; for example, the particular directions that the lattices are arranged along with within the sidewalls may be destroyed. In such case, the structure of the shallow trench T3 may be less stable. According to the embodiments of the present disclosure, oxidation of the sidewalls of the shallow trench T3 helps to repair the damaged structure, and hence the stability of the surfaces of the sidewalls of the shallow trench T3 is highly improved.

Figure 7:
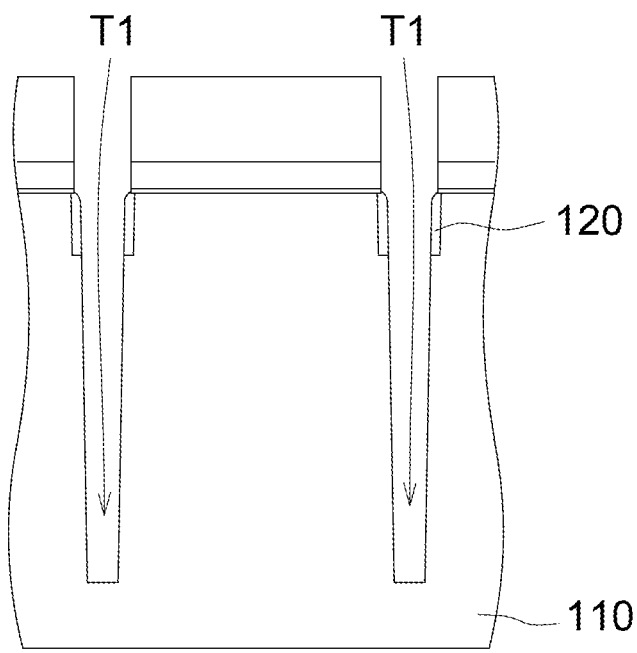

Next, as shown in FIG. 7, the silicon substrate 110 and the oxide layer 520 are etched according to the patterned hard mask 190' for forming the deep trench T1. In the embodiment, the shallow trench T3 defines the deep trench T1, and the deep trench T1 can be regarded as an extension of the shallow trench T3. The deep trench T1 has a depth of about 2-4 μm. After the deep trench T1 is formed, the etched oxide layer forms the spacer 120 on the upper portion of the deep trench T1. In the embodiment, the formation of the hard mask layer 190 in the earlier manufacturing step provides that the two etching processes for forming the shallow trench T3 and for forming the deep trench T1 can both be performed according to the patterned hard mask 190'.

Figure 8:
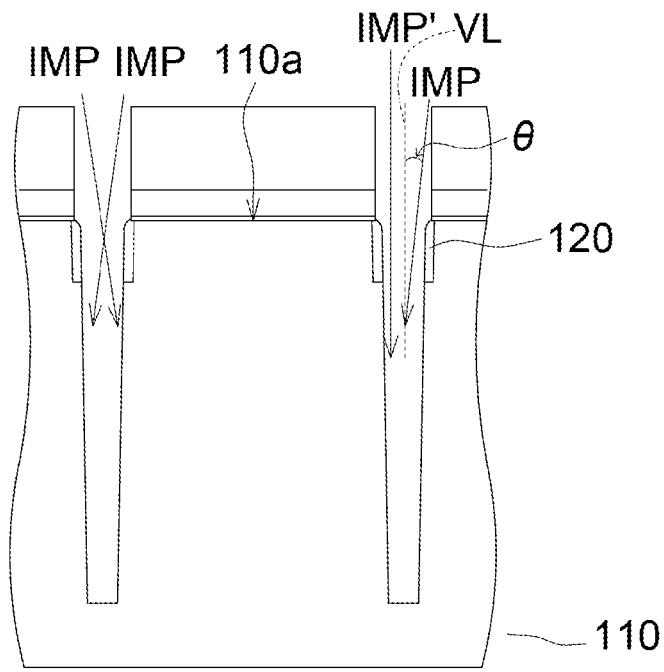
Figure 9:
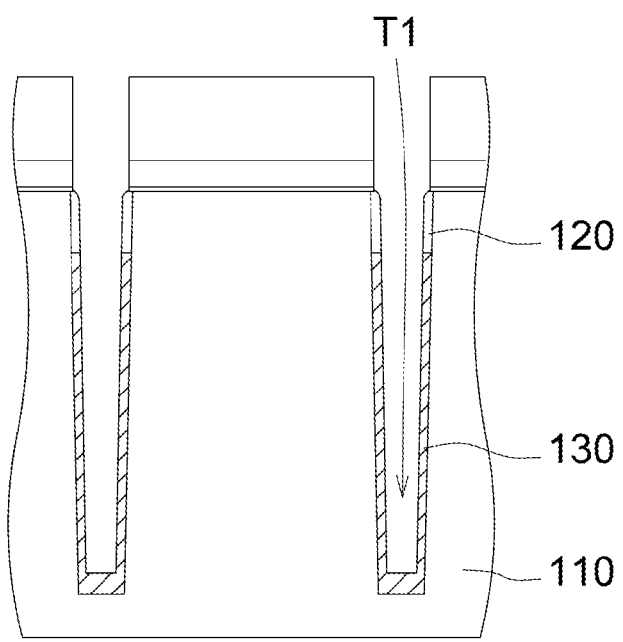

Referring to FIG. 8-9, the doped region 130 is formed on the lower portion of the sidewall of the deep trench T1. As shown in FIG. 8, the doped region 130 may be formed by performing an implantation process on the lower portion of the sidewall of the deep trench T1. In the embodiment, the doped region 130 may be p type, and the dopants for the doped region 130 may be B or BF.

In the embodiment, the implantation process is performed at an angle θ of 0° to less than 10°. Preferably, the angle θ is about 0° to 3°. An implantation direction with the angle θ of 0° is defined as perpendicular to the top surface 110a of the silicon substrate 110. That is, as shown in FIG. 8, the angle θ of the implantation process is defined as the angle between the implantation direction IMP and the vertical line VL, which is perpendicular to the top surface 110a of the silicon substrate 110. For example, as shown in FIG. 8, the implantation process performed along with the implantation direction IMP' is at the angle θ of 0°.

In an embodiment, the implantation process may comprise a plurality of implanting steps performed at different angles, and the angles may range from 0° to less than 10°. These different implanting steps may be performed consecutively or simultaneously. For example, the first implantation step is performed at an angle of 0° for implanting the bottom of the deep trench T1, and the next implantation step is performed at an angle of such as 3°, which is larger than 0°, the angle at which the first implantation step is performed, for implanting the sidewalls of the deep trench T1. Optionally, the following implantation step may be performed at an even larger angle, for example, 5°.

In the embodiment, the implantation process is performed after the spacer 120 is formed. As such, the regions near the top surface 110a of the silicon substrate 110 are protected by the spacer 120 from the implantation process. Accordingly, the characteristics of the semiconductor device are not influenced by the formation of the doped region 130. As shown in FIG. 9, the doped region 130 is formed after the implantation process.

Figure 10:
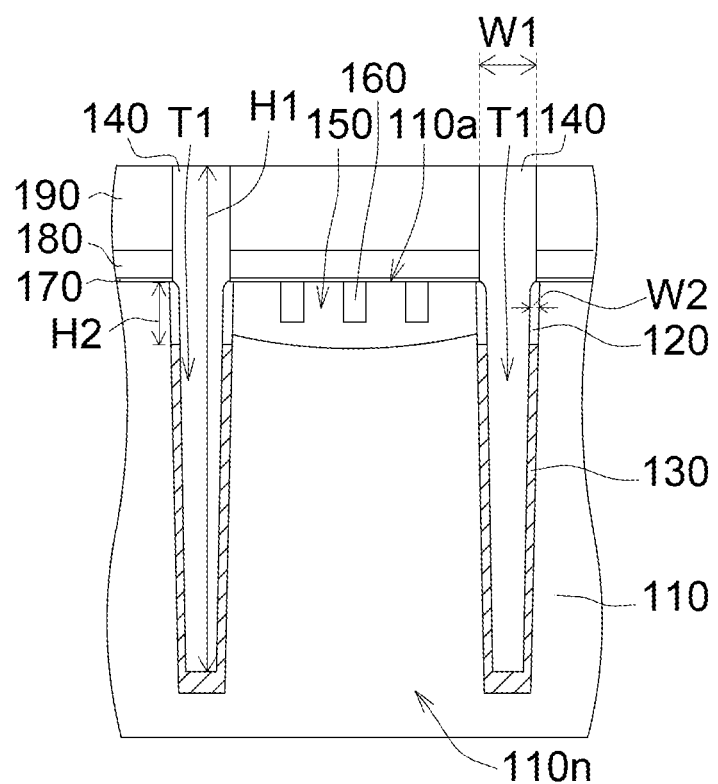

Referring to FIG. 10, the deep trench isolation 140 is formed in the deep trench T1. In the embodiment, the deep trench isolation 140 is formed by such as filling an electric isolating material into the deep trench T1. The electric isolating material may be oxide or mixture(s) of oxide and polysilicon.

As shown in FIG. 10, the P well 150 may be formed in the silicon substrate 110 and adjacent to the spacer 120, and at least one NMOS transistor 160 may be formed in the P well 150. In the embodiment, the P well 150 is formed after the spacer 120 is formed, such that the high manufacturing temperature of the formation of the spacer 120 does not affect the formation of the P well 150. As such, the semiconductor device 200 is formed.

In an embodiment, while the doped region 130 is p type, an n type-doped region 110n may be formed in the silicon substrate 110 and between the deep trench isolations 140. In such case, a junction forms between the doped region 130 and the n type-doped region 110n. In the embodiment, the n type-doped region 110n is formed after the formation of the oxide layer 520, such that the n type-doped region 110n is not affected or damaged by the high manufacturing temperature of the formation of the oxide layer 520. In an embodiment, while the semiconductor device 200 of the present disclosure is a CMOS image sensor device, the n type-doped region 110n is such as the photodiode implantation region, by which light is absorbed, and depletion region(s) can be formed in the n type-doped region 110n.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of a semiconductor device, comprising:
    forming a deep trench in a silicon substrate;
    forming a spacer on an upper portion of the sidewall of the deep trench, wherein a height of the spacer is about 1.5-4 KÅ;
    forming a doped region on a lower portion of the sidewall of the deep trench, wherein the doped region is p type;
    forming a deep trench isolation in the deep trench;
    forming a P well in the silicon substrate; and
    after forming the spacer, forming an n type-doped region adjacent to the P well and separating the P well and the doped region from each other for forming a junction between the doped region and the n typed-doped region.

2. The manufacturing method according to claim 1, wherein the doped region is formed by performing an implantation process on the lower portion of the sidewall of the deep trench.

3. The manufacturing method according to claim 2, wherein the implantation process is performed at an angle of 0° to less than 10°, and the angle of 0° is defined as perpendicular to the top surface of the silicon substrate.

4. The manufacturing method according to claim 2, wherein the implantation process comprises a plurality of implanting steps performed at different angles, and the angles range from 0° to less than 10°.

5. The manufacturing method according to claim 2, wherein the implantation process is performed after the spacer is formed.

6. The manufacturing method according to claim 1, wherein forming the deep trench in the silicon substrate comprises:
    providing a patterned hard mask on the silicon substrate; and
    etching the silicon substrate according to the patterned hard mask for forming a shallow trench having a depth of about 1.5-4 KÅ.

7. The manufacturing method according to claim 6, wherein forming the spacer comprises:
    forming an oxide layer in the shallow trench; and
    etching the silicon substrate and the oxide layer according to the patterned hard mask after forming the shallow trench for forming the deep trench having a depth of 2-4 μm, wherein the oxide layer forms the spacer on the upper portion of the deep trench.

8. The manufacturing method according to claim 7, wherein the oxide layer is formed by oxidizing the sidewall of the shallow trench.

9. The manufacturing method according to claim 1, further comprising:
    forming at least an NMOS transistor in the P well.

* * * * *